United States Patent
Aoki et al.

(10) Patent No.: US 8,674,797 B2
(45) Date of Patent: Mar. 18, 2014

(54) MAGNETIC FIELD GENERATOR

(75) Inventors: Masaaki Aoki, Takatsuki (JP); Michiaki Kishimoto, Takeo (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 13/144,996

(22) PCT Filed: Feb. 26, 2010

(86) PCT No.: PCT/JP2010/053166
§ 371 (c)(1),
(2), (4) Date: Jul. 18, 2011

(87) PCT Pub. No.: WO2010/098469
PCT Pub. Date: Sep. 2, 2010

(65) Prior Publication Data
US 2011/0273254 A1    Nov. 10, 2011

(30) Foreign Application Priority Data
Feb. 27, 2009   (JP) ................................. 2009-045881

(51) Int. Cl.
H01F 7/02   (2006.01)
H01F 3/00   (2006.01)
H01F 7/00   (2006.01)

(52) U.S. Cl.
USPC ........... 335/306; 335/296; 335/301; 335/302; 335/303; 29/599

(58) Field of Classification Search
USPC ............. 335/306, 296, 301, 302, 303; 29/599
See application file for complete search history.

(56) References Cited

U.S. PATENT DOCUMENTS 4,217,568 A * 8/1980 Chiba et al. .................... 335/298
4,672,346 A * 6/1987 Miyamoto et al. ............ 335/296
(Continued)

FOREIGN PATENT DOCUMENTS

| JP | 60-71112 | 5/1985 |
| JP | 60-239005 | 11/1985 |

(Continued)

OTHER PUBLICATIONS

International Search Report for International Application No. PCT/JP2010/053166 dated Mar. 15, 2010.

(Continued)

*Primary Examiner* — Mohamad Musleh
(74) *Attorney, Agent, or Firm* — Kratz, Quintos & Hanson, LLP

(57) ABSTRACT

There is provided a magnetic field generator in which separation and dislocation of permanent magnets from their permanent magnet groups is prevented easily and reliably for a long period of time without sacrificing productivity. A magnetic field generator 10 includes a permanent magnet group 14a which is provided on a plate yoke 12a; a pole piece 16a which is provided in a first main surface of the permanent magnet group 14a, leaving an exposed region 18b thereon; a frame-like member 34 which is provided on the plate yoke 12a to surround the permanent magnet group 14a; and a flange-shaped member 36 which is provided in the pole piece 16a to cover the exposed region 18b. Presser bolts 44 are threaded into the frame-like member 34 and press an outer circumferential surface 18a of the permanent magnet group 14a directly or via insertion members 42. Presser bolts 48 are threaded into the flange-shaped member 36, and press the exposed region 18b of the permanent magnet group 14a directly or via insertion members 46. A plate yoke 12b has the same configuration.

6 Claims, 9 Drawing Sheets

(56) References Cited

U.S. PATENT DOCUMENTS

| | | | |
|---|---|---|---|
| 6,198,286 B1 * | 3/2001 | Trequattrini et al. | 324/319 |
| 6,452,472 B1 | 9/2002 | Aoki | |
| 6,664,878 B1 * | 12/2003 | Chen et al. | 335/296 |
| 6,781,495 B2 * | 8/2004 | Aoki et al. | 335/301 |
| 6,828,891 B2 * | 12/2004 | Jarvis et al. | 335/299 |
| 6,897,751 B2 * | 5/2005 | Aoki et al. | 335/296 |
| 7,463,129 B1 * | 12/2008 | Danby et al. | 335/299 |
| 7,796,002 B2 * | 9/2010 | Hashimoto et al. | 335/306 |
| 2002/0062884 A1 | 5/2002 | Kaneko | |
| 2004/0145436 A1 * | 7/2004 | Strom | 335/306 |
| 2004/0194288 A1 | 10/2004 | Lochner | |
| 2004/0194289 A1 | 10/2004 | Zheng | |
| 2004/0246083 A1 | 12/2004 | Aoki et al. | |
| 2008/0100406 A1 | 5/2008 | Hashimoto | |

FOREIGN PATENT DOCUMENTS

| | | |
|---|---|---|
| JP | 60-257109 | 12/1985 |
| JP | 61-152956 | 9/1986 |
| JP | 63-107006 | 5/1988 |
| JP | 8-336273 | 12/1996 |
| JP | 10-275720 | 10/1998 |
| JP | 11-186013 | 7/1999 |
| JP | 2001-46351 | 2/2001 |
| JP | 2001-326118 A1 | 11/2001 |
| JP | 2002-190404 A1 | 7/2002 |
| JP | 2003-168604 A1 | 6/2003 |
| JP | 2003-293008 A1 | 10/2003 |
| JP | 2004-305743 A1 | 11/2004 |
| JP | 2004-305746 A1 | 11/2004 |
| JP | 2004-358097 A1 | 12/2004 |
| JP | 2008-279265 A1 | 11/2008 |

OTHER PUBLICATIONS

Extended European Search Report mailed May 13, 2013 in counterpart application No. 10746348.1 (9 pages).

* cited by examiner (a)

(b)

(a)

(b)

F I G. 8
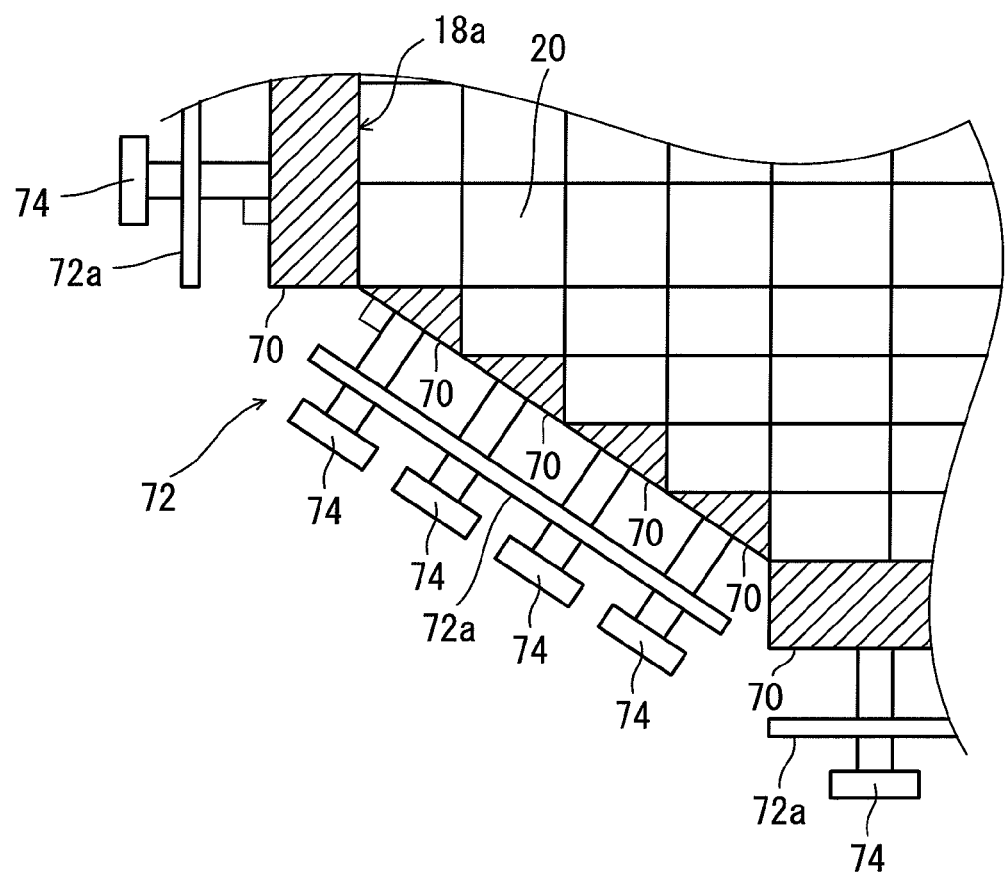

MAGNETIC FIELD GENERATOR

TECHNICAL FIELD

The present invention relates to magnetic field generators, and more specifically to permanent-magnet type magnetic field generators.

BACKGROUND ART

Conventionally, in permanent magnet type magnetic field generators used for MRI (Magnetic Resonance Imaging) etc., permanent magnets which constitute a permanent magnet group are bonded to adjacent permanent magnets, a plate yoke or both of these with adhesive. Patent Document 1 discloses a technique for preventing separation of the permanent magnets from the permanent magnet group in the permanent magnet type magnetic field generators.

Patent Document 1: JP-A 2004-358097

SUMMARY OF THE INVENTION

Problems to be Solved by the Invention

Permanent magnets which constitute a permanent magnet group are subject to size variation due to machining accuracy of machining equipment or due to sintering operation if the permanent magnets are sintered products. Therefore, the permanent magnet group is also subject to shape and size variation. For example, if permanent magnets have a size variation of approximately 0.1 mm per magnet, a permanent magnet group which includes twenty of the permanent magnets in its width direction, can have a maximum of approximately 2 mm difference in the width of the permanent magnet group. Also, there is variation in the thickness of adhesive layers which bond the permanent magnets to adjacent permanent magnets or the plate yoke, and this is another cause for the size variation in the permanent magnet group.

In order to achieve more reliable separation prevention of the permanent magnets, the technique in Patent Document 1 requires a set of custom-made permanent magnet fixing members etc., made to the shapes and sizes of individual permanent magnet groups in each apparatus. In magnetic field generators for use in MRI, a large number of permanent magnets are used in the permanent magnet groups. As a result, variation in the shape and the size of the permanent magnet groups tends to be large, and the need for custom-made permanent magnet fixing members are especially high. However, custom-made permanent magnet fixing members require a substantial amount of time to manufacture, resulting in decreased productivity in the manufacture of the apparatus.

Also, in a long run (typically no less than ten years), permanent magnet type magnetic field generators for MRI are subject to problems due to the age. Oxidization of the permanent magnets, deterioration of the adhesive, vibration and impact for example, can break bonding between the permanent magnets or between permanent magnets and the plate yokes, resulting in dislocation of the permanent magnets. Especially, in cases where the permanent magnets are provided by an R—Fe—B sintered magnet (R is provided by one of the rare-earth elements including Y) which has superb magnetic characteristics, there is an increased risk of the problem of permanent magnet dislocation since the magnet of this type contains a rare-earth element and iron, can be oxidized more easily and lose some of its bonding performance if stored in a high-temperature, high-humidity environment. In magnetic field generators, a 1 mm dislocation of a permanent magnet in its permanent magnet group results in approximately a 40 ppm change in magnetic field intensity in a uniform magnetic field space inside the magnetic field generator. Such a change, even as small as 40 ppm, affects MRI imaging performance for example, and a result is decreased quality of image.

Therefore, a primary object of the present invention is to provide a magnetic field generator in which separation and dislocation of permanent magnets from their permanent magnet groups is prevented easily and reliably for a long period of time without sacrificing productivity.

Means for Solving the Problems

According to an aspect of the present invention, there is provided a magnetic field generator which includes a permanent magnet group having a plurality of permanent magnets bonded together, for generation of a magnetic field on a first main-surface side of the permanent magnet group; a cover member provided along the permanent magnet group; and a pressing member provided in the cover member for pressing the permanent magnet group.

In the present invention, even if there is a gap between the permanent magnet group and the cover member, it is possible to press the permanent magnet group with the pressing member provided in the cover member, whereby the permanent magnets are fixed strongly and therefore separation and dislocation of the permanent magnets from the permanent magnet group is prevented easily and reliably for a long period of time. Hence, it is possible to prevent image quality deterioration caused by dislocation of permanent magnets in the permanent magnet group. By using the pressing member as described, it becomes easy to solve the problem of shape and size variation in the permanent magnet group. Also, the invention can improve productivity since it is easy to prevent separation and dislocation of the permanent magnets from the permanent magnet group without preparing a custom-made permanent magnet fixing member etc., to fit to a unique shape and size of an individual permanent magnet group for each apparatus.

Preferably, the magnetic field generator further includes an insertion member for insertion into a gap between the permanent magnet group and the cover member, and the pressing member presses the permanent magnet group via the insertion member. In this case, the insertion member is inserted into a relatively large gap between the permanent magnet group and the cover member, and the insertion member is pressed to the permanent magnet group by the pressing member. In other words, the pressing member presses the permanent magnet group via the insertion member. By using the insertion member in between, it becomes possible to press a large area of the permanent magnet group stably with a single pressing member, and to prevent separation and dislocation of the permanent magnets from the permanent magnet group more reliably while reducing the number of the pressing members. Also, by placing the insertion member in between, the invention prevents damage to the permanent magnets. Further, the insertion member can fill or reduce the gap between the permanent magnet group and the cover member. This eliminates the need for custom-made permanent magnet fixing members, etc. to fit to unique shapes and sizes of individual permanent magnet groups for each apparatus, making it possible to further simplify the shape of the cover member.

Further preferably, the cover member includes a frame-like member provided to surround the permanent magnet group, and the pressing member is provided in the frame-like member. In this case, the permanent magnet group is pressed from an outer circumferential surface side, by the pressing member which is provided in the frame-like member. By using the frame-like member which surrounds the permanent magnet group, as the cover member, the invention provides easy and reliable solution for preventing separation and dislocation of the permanent magnets toward the outer circumferential surface of the permanent magnet group, making it possible to improve productivity.

Further, preferably, the magnetic field generator further includes a pole piece provided in the first main surface of the permanent magnet group while leaving an exposed region in the first main surface. In this arrangement, the cover member includes a flange-shaped member provided in an outer circumferential surface of the pole piece to cover the exposed region of the permanent magnet group, and the pressing member is provided in the flange-shaped member. In this case, the permanent magnet group is pressed from an exposed-region side, by the pressing member which is provided in the flange-shaped member. By using the flange-shaped member which is provided to cover the exposed region, as the cover member, the invention provides easy and reliable solution for preventing separation and dislocation of the permanent magnets toward the exposed region of the permanent magnet group, making it possible to improve productivity.

Preferably, the cover member is a non-magnetic member. The cover member provided by a non-magnetic member makes it possible to prevent separation and dislocation of the permanent magnets from the permanent magnet group without causing adverse influence to the intended magnetic field.

The above-described object and other objects, characteristics, aspects and advantages of the present invention will become clearer from the following detailed description of embodiments of the present invention with reference to the attached drawings.

BRIEF DESCRIPTION OF THE DRAWINGS

FIG. 5(a) is a plan view showing a state where insertion members are inserted into gaps between an outer circumferential surface and a frame-like member whereas FIG. 5(b) is a side view showing a state where insertion members are inserted into gaps between an exposed region and a flange-shaped member.

FIG. 8 is a plan view showing a case where a block-shaped insertion member is used.

LEGEND

Figure 1:
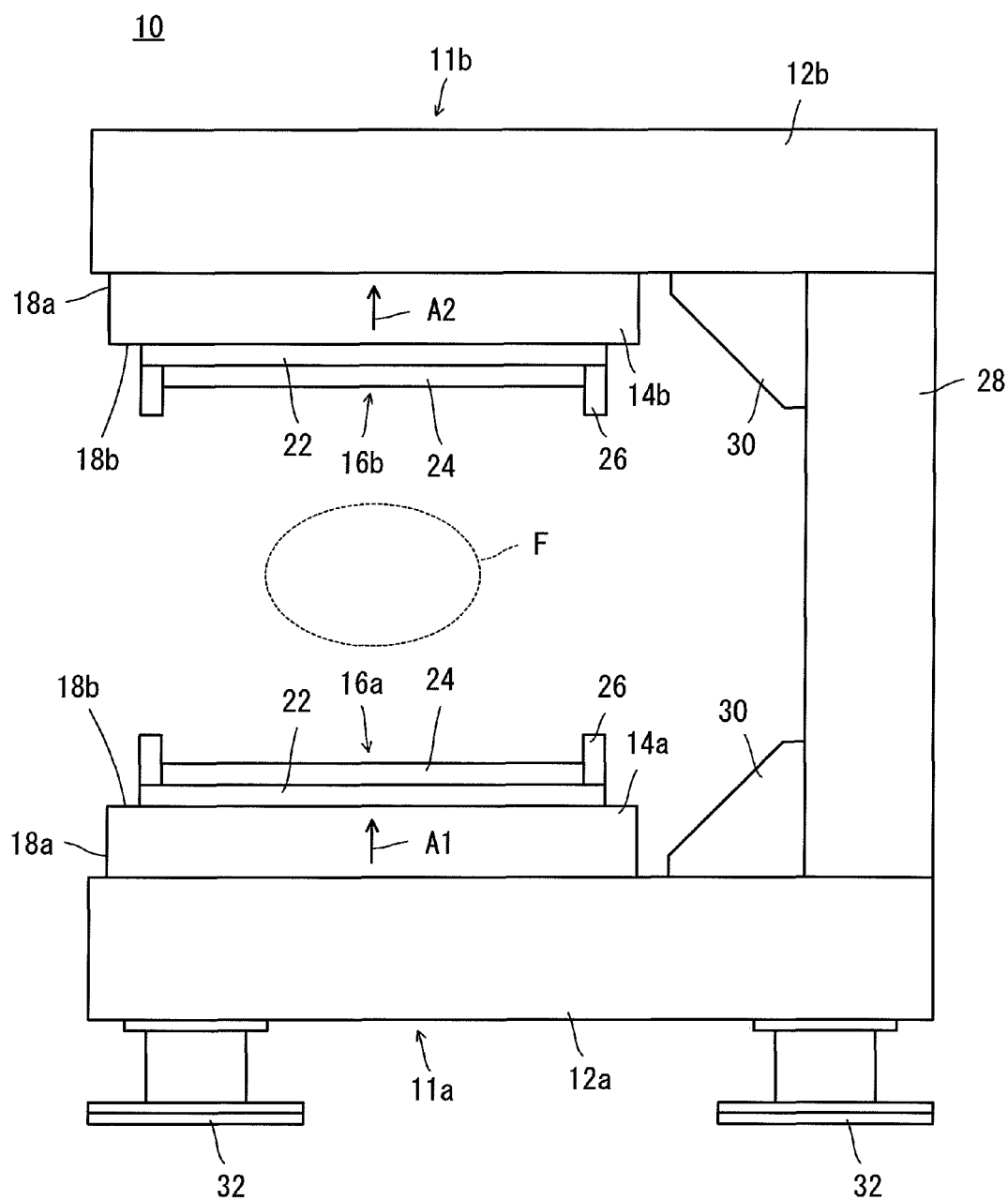
FIG. 1 is a schematic side view of a magnetic field generator to which the present invention is applied.

10 Magnetic field generator
11a, 11b Magnetic pole units
12a, 12b Plate yokes
14a, 14b Permanent magnet groups
16a, 16b Pole pieces
18a Outer circumferential surface of permanent magnet group
18b Exposed region in permanent magnet group
10 Permanent magnet
34, 72 Frame-like members
36 Flange-shaped member
42, 46, 62, 66, 70 Insertion members
44, 48, 64, 68, 74 Presser bolts
50, 50a, 50b Plate-like members

MODES OF EMBODYING THE INVENTION

Hereinafter, embodiments of the present invention will be described with reference to the drawings.

Referring to FIG. 1, a magnetic field generator 10 according to an embodiment of the present invention is an open-type, permanent-magnet-type magnetic field generator for MRI, and includes a pair of magnetic pole units 11a and 11b opposed to each other with a space in between.

The magnetic pole units 11a and 11b include plate yokes 12a and 12b respectively. The pair of plate yokes 12a and 12b have opposed surfaces provided with permanent magnet groups 14a and 14b respectively. The permanent magnet groups 14a and 14b have opposed surfaces (first main surfaces) provided with pole pieces 16a and 16b respectively. Specifically, the permanent magnet group 14a has the first main surface and a second main surface provided with the pole piece 16a and the plate yoke 12a respectively. The permanent magnet group 14b has the first main surface and a second main surface provided with the pole piece 16b and the plate yoke 12b respectively.

Figure 2:
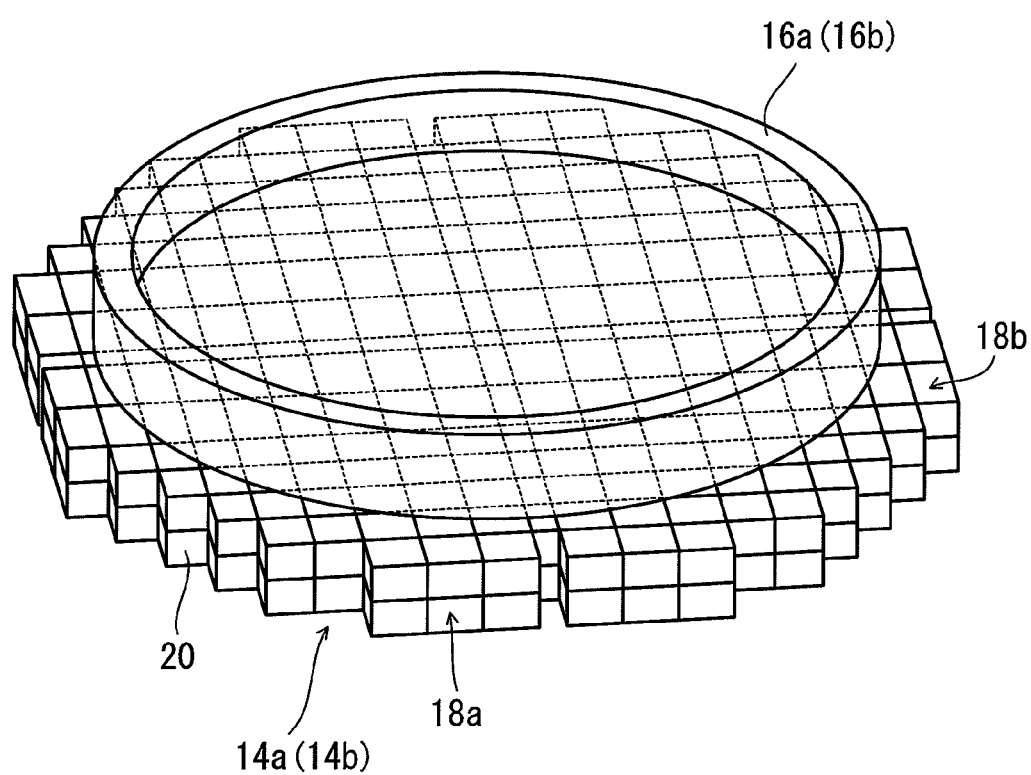
FIG. 2 is a perspective view showing an example of a permanent magnet group and a pole piece.

Referring also FIG. 2, each of the permanent magnet groups 14a and 14b is made of a plurality of cubic or rectangular parallelepiped permanent magnets 20 bonded together into a one-piece component, which has a zigzag (stepped) outer circumferential surface 18a.

In the permanent magnet group 14a, all permanent magnets 20 are disposed in the same direction of magnetization, and in the permanent magnet group 14b, all permanent magnet 20 are disposed in the same direction of magnetization. As shown in FIG. 1, in this embodiment, the permanent magnets 20 in the permanent magnet group 14a have their direction of magnetization aligned in Arrow A1 Direction whereas the permanent magnets 20 in the permanent magnet group 14b have their direction of magnetization aligned in Arrow A2 Direction. Therefore, the permanent magnet group 14a has its N pole on its first main surface (the surface opposing to the permanent magnet group 14b) whereas the permanent magnet group 14b has its S pole on its first main surface (the surface opposing to the permanent magnet group 14a).

The permanent magnets 20 are provided by a high magnetic flux density type R—Fe—B sintered magnet (R is provided by one of the rare-earth elements including Y) such as NEOMAX-47 (manufactured by Hitachi Metals, Ltd). The permanent magnets 20 are obtained by assembling unillustrated unit magnets.

As shown in FIG. 1 and FIG. 2, the pole piece 16a is provided in the first main surface of the permanent magnet group 14a, leaving an exposed region 18b in the first main surface of the permanent magnet group 14a. Likewise, the pole piece 16b is provided in the first main surface of the permanent magnet group 14b, leaving an exposed region 18b in the first main surface of the permanent magnet group 14b. The exposed regions 18b are regions which are left exposed in the first main surfaces of the permanent magnet groups 14a, 14b when the pole pieces 16a, 16b are provided in the first main surfaces of the permanent magnet groups 14a, 14b respectively.

As shown in FIG. 1, the pole piece 16a includes a disc-shaped base plate 22 which is made of iron for example and is disposed on the first main surface of the permanent magnet group 14a. On the base plate 22, a silica steel sheet 24 is formed to prevent generation of eddy current. The silica steel sheet 24 is fixed on the base plate 22 with adhesive. The base plate 22 has a circumferential edge portion formed with an annular projection 26 made of iron for example, for increased magnetic field intensity around the edge portion to obtain a uniform magnetic field. The pole piece 16b has the same configuration as the pole piece 16a.

The plate yokes 12a and 12b are magnetically connected by a platy support yoke 28. Specifically, the support yoke 28 is connected with the plate yokes 12a and 12b, so that the support yoke 28 has its lower end surface placed along an edge of an end on an upper surface of the plate yoke 12a, while the support yoke 28 has its upper end surface placed along an edge of an end on a lower surface of the plate yoke 12b. Therefore, the plate yokes 12a and 12b and the support yoke 28 are connected at an approximately 90 degree angle, to form a U shape when viewed from a side.

Figure 3:
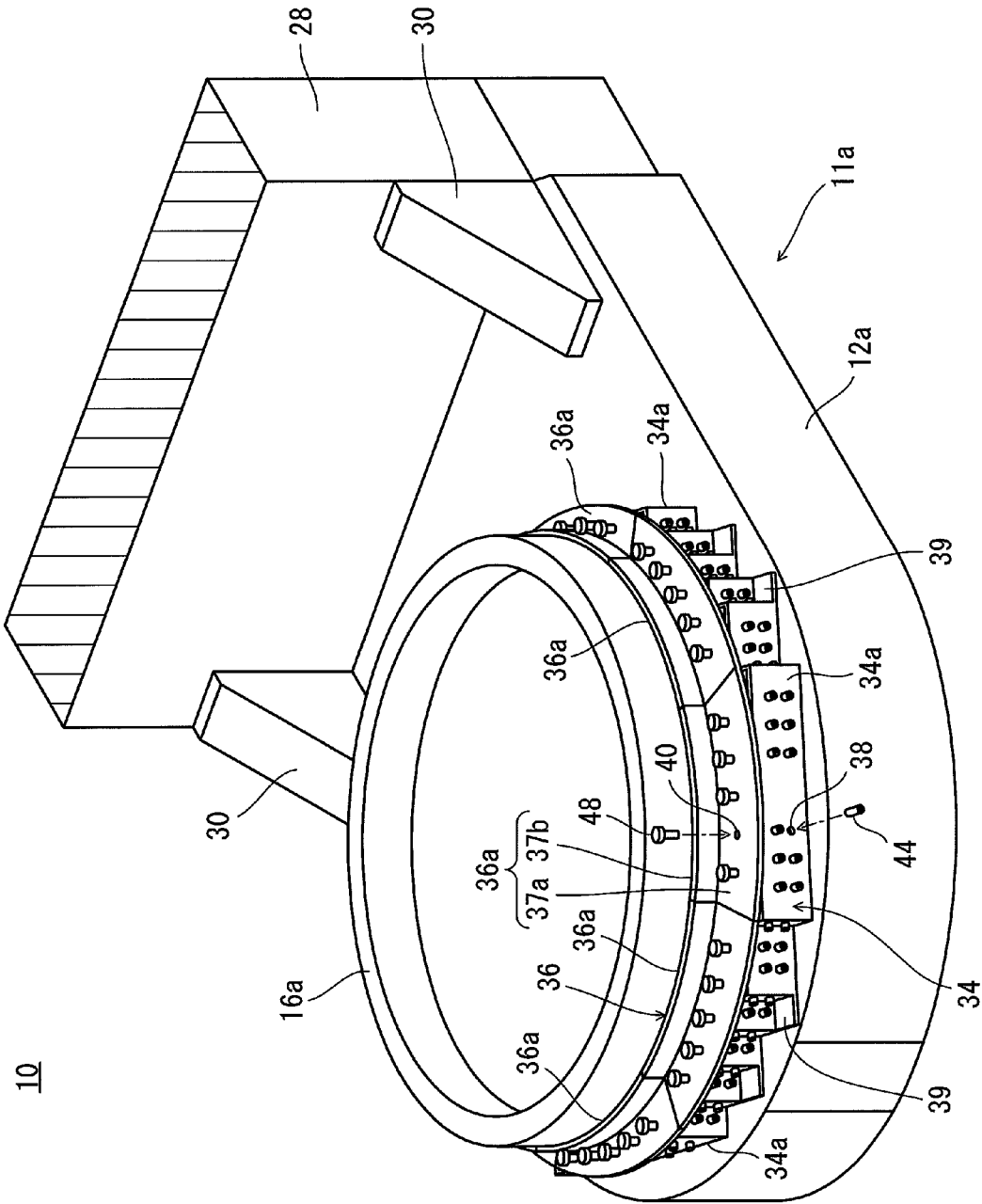
FIG. 3 is a partial perspective view showing a magnetic field generator including a frame-like member and a flange-shaped member.

Referring also to FIG. 3, reinforcing members 30 are provided on an inner surface which is made as a result of connecting the plate yoke 12a and the support yoke 28, at the farthest position therein from the permanent magnet group 14a (i.e. at both ends of the inner surface area which is made by the plate yoke 12a and the support yoke 28, according to the present embodiment). Likewise, reinforcing members 30 are provided on an inner surface which is made as a result of connecting the plate yoke 12b and the support yoke 28. Also, the plate yoke 12a has a lower surface provided with four leg members 32.

In the magnetic field generator 10 as described, a magnetic field is generated on the first-main-surface side of the permanent magnet groups 14a and 14b, i.e. in a space between the pole pieces 16a and 16b, and it is required that a magnetic field intensity in a uniform magnetic field space F (see FIG. 1) is not lower than 0.2 T.

As shown in FIG. 3, in the magnetic field generator 10, the magnetic pole unit 11a includes a frame-like member 34 which is provided to surround the permanent magnet group 14a; and a flange-shaped member 36 which is provided to cover the exposed region 18b of the permanent magnet group 14a.

It should be noted here that FIG. 3 does not show the magnetic pole unit 11b. Obviously however, the magnetic pole unit 11b has an up-down symmetrical structure with respect to the magnetic pole unit 11a.

Figure 4:
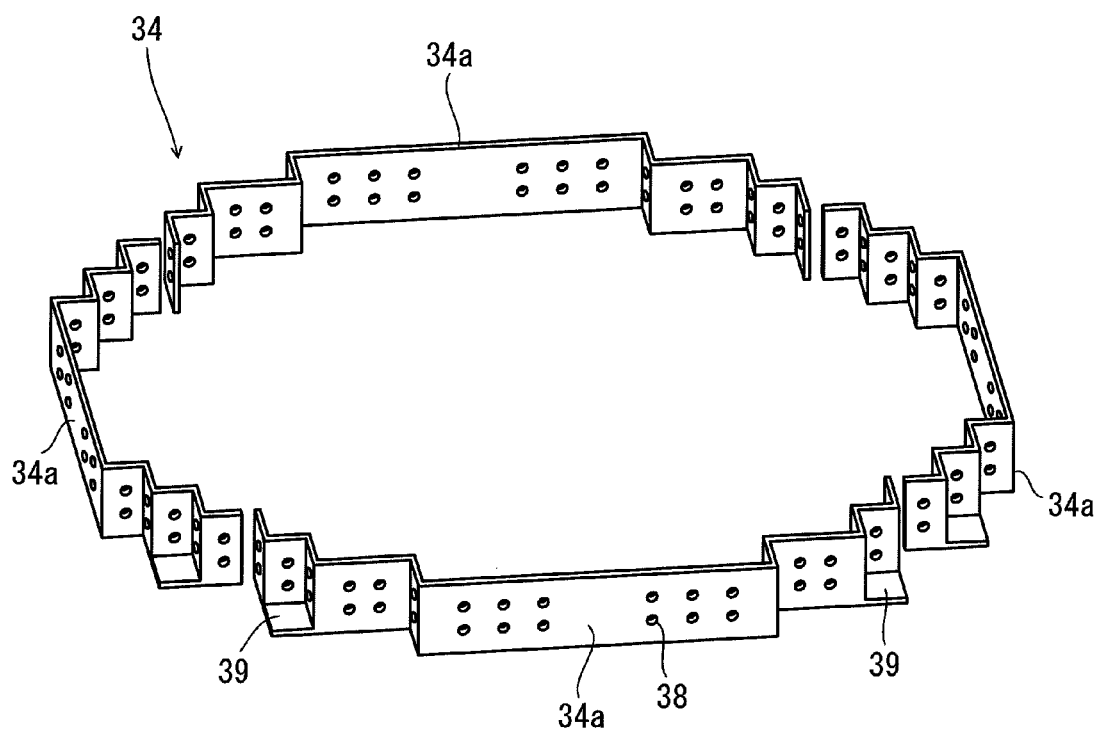
FIG. 4 is an exploded perspective view of the frame-like member.

As shown in FIG. 4, the frame-like member 34 includes a plurality (four in this embodiment) of frame-like member pieces 34a. Each of the frame-like member pieces 34a has a zigzag shape following its corresponding portion of the outer circumferential surface 18a (see FIG. 2) of the permanent magnet group 14a. Therefore, the frame-like member 34 as a whole has a zigzag shape following the outer circumferential surface 18a of the permanent magnet group 14a. Each frame-like member piece 34a is made of a non-magnetic material (non-magnetic metal) such as aluminum and stainless steel, having a thickness of approximately 1 mm through 10 mm. Each frame-like member piece 34a includes a plurality of bolt holes 38 penetrating the piece from the outer side (the side away from the permanent magnet group 14a) to the inner side (the side opposing to the permanent magnet group 14a); and platy mounting portions 39a for mounting the frame-like member piece 34a to the plate yoke 12a. Each frame-like member piece 34a is disposed in contact with the outer circumferential surface 18a of the permanent magnet group 14a, and then has its mounting portions 39 fastened to the plate yoke 12a with unillustrated fixing members such as bolts, whereby each frame-like member piece 34a is fixed to the plate yoke 12a.

Using the frame-like member 34 which is a dividable structure has a following advantage for example: When magnetic field adjustment is made by adding a permanent magnet(s), a magnetic member(s) or a non-magnetic member(s) to the permanent magnet group 14a, and the adjustment has altered the shape of the outer circumferential surface 18a, such an alteration can easily be dealt with by replacing only part of the frame-like member piece 34a.

As shown in FIG. 3, the flange-shaped member 36 is provided in an outer circumferential surface of the pole piece 16a, to cover the exposed region 18b (see FIG. 2) of the permanent magnet group 14a. The flange-shaped member 36 includes a plurality (eight in this embodiment) of flange-shaped member pieces 36a each having a generally L-shaped vertical section and an arcuate shape in a plan view. Each of the flange-shaped member pieces 36a is made of a non-magnetic material such as aluminum and stainless steel, has a thickness of approximately 1 mm through 10 mm, and includes a first portion 37a opposed to the exposed region 18b of the permanent magnet group 14a; and a second portion 37b opposed to the outer circumferential surface of the pole piece 16a. The first portion 37a in each flange-shaped member piece 36a includes a plurality of bolt holes 40 penetrating the portion from the upper side through the lower side. The first portion 37a is disposed in contact with the exposed region 18b of the permanent magnet group 14a, and the second portion 37b is fastened to an outer circumferential surface of the pole piece 16a with unillustrated fixing members such as bolts or by welding, etc., whereby each flange-shaped member piece 36a is provided on the outer circumferential surface of the pole piece 16a.

Using the flange-shaped member 36 which is a dividable structure has an advantage of reduced eddy current generated in the flange-shaped member 36 and therefore reduced adverse influence to the uniform magnetic field space F. If the eddy current reduction has a higher importance, a member which has a high electrical resistance may be disposed, or a gap may be provided, between the pole piece 16a and each flange-shaped member piece 36a, as well as between two mutually adjacent flange-shaped member pieces 36a, to isolate them.

Even if the frame-like member 34 is provided in contact with the outer circumferential surface 18a of the permanent magnet group 14a as mentioned earlier, there is still a chance for gaps between the outer circumferential surface 18a and the frame-like member 34. Likewise, even if the flange-shaped member 36 is provided in contact with the exposed region 18b of the permanent magnet group 14a, there is still a chance for gaps between the exposed region 18b and the flange-shaped member 36. This is due to size variation of the permanent magnets 20 which are provided by rare-earth sintered magnets for example. Due to technical limitation to make these permanent magnets 20 exactly to a predetermined size, and due to variation in the thickness of adhesive layer, the permanent magnet group 14a can have stepped surfaces which are not as smooth as ideal.

Figure 5:
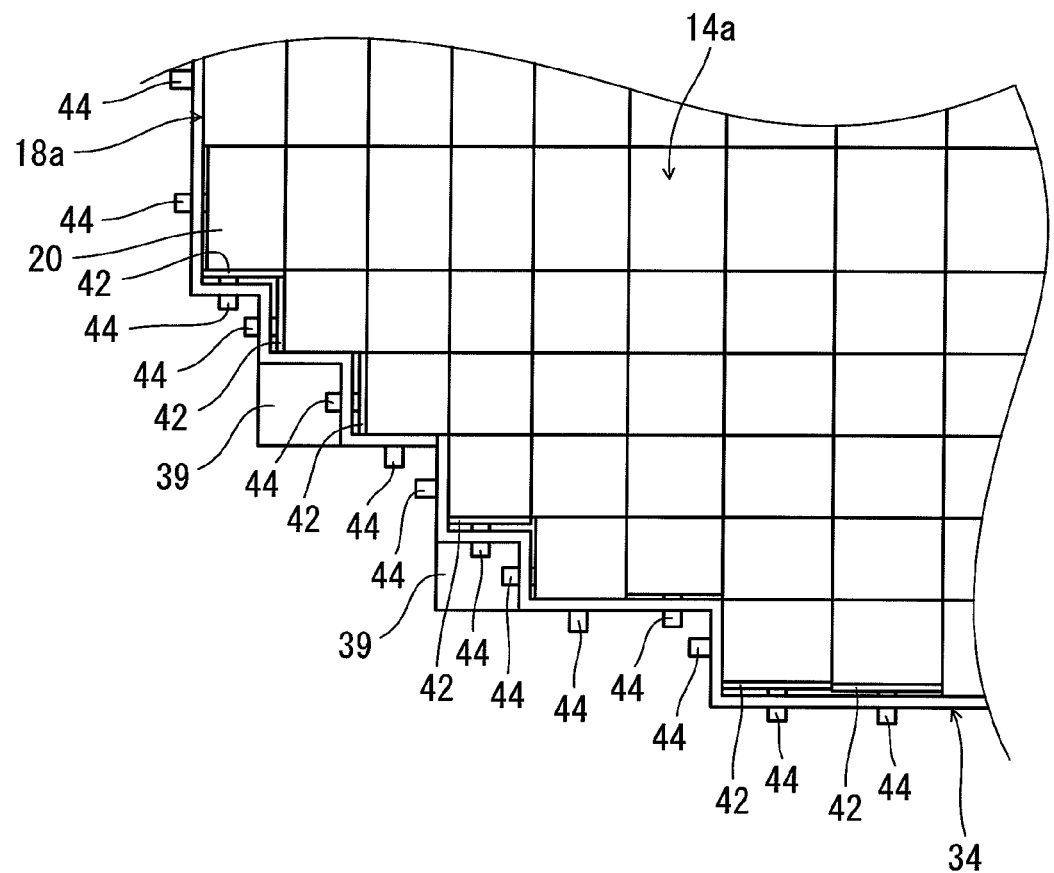
FIG. 5 shows states where insertion members are inserted into gaps between the permanent magnet group and a cover member.
Figure 5:
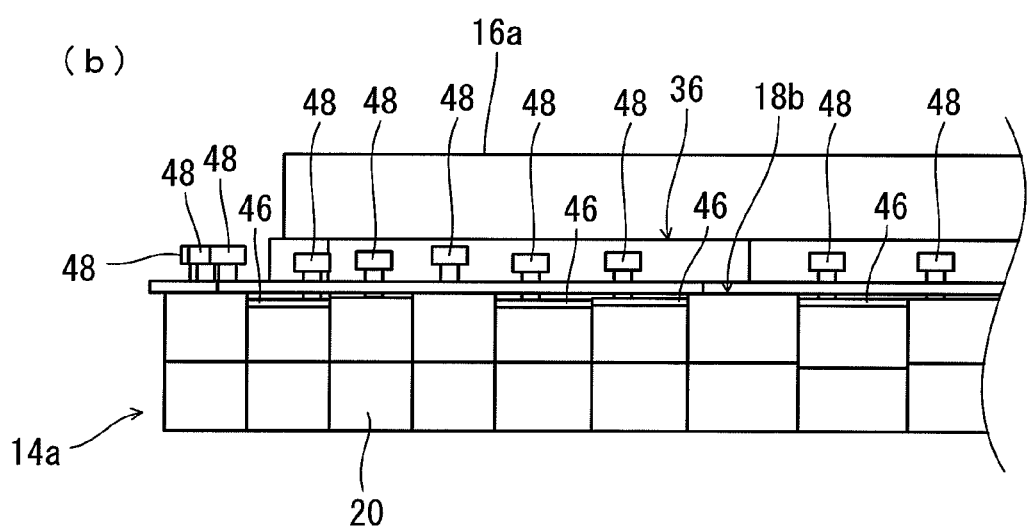

As a solution, an inspection is made to the plate yoke 12a with the frame-like member 34 mounted thereto, to see if there is any gap between the outer circumferential surface 18a of the permanent magnet group 14*a* and the frame-like member 34. Then, as shown in FIG. 5(*a*), an insertion member 42 is inserted to any relatively large gap found between the outer circumferential surface 18*a* and the frame-like member 34. The insertion member 42 thus inserted is then pressed to the outer circumferential surface 18*a* with a presser bolt 44 which is threaded into the bolt hole 38 of the frame-like member 34. In other words, the outer circumferential surface 18*a* is pressed by the presser bolt 44 via the insertion member 42. If the gap found between the outer circumferential surface 18*a* and the frame-like member 34 is too small to insert the insertion member 42, the outer circumferential surface 18*a* is pressed directly by the presser bolt 44.

Likewise, an inspection is made to the pole piece 16*a* with the flange-shaped member 36 mounted thereto, to see if there is any gap between the exposed region 18*b* of the permanent magnet group 14*a* and the flange-shaped member 36. Then, as shown in FIG. 5(*b*), a platy insertion member 46 is inserted to any relatively large gap found between the exposed region 18*b* and the flange-shaped member 36. The insertion member 46 thus inserted is then pressed to the exposed region 18*b* with a presser bolt 48 which is threaded into the bolt hole 40 of the flange-shaped member 36. In other words, the exposed region 18*b* is pressed by the presser bolt 48 via the insertion member 46. If the gap found between the exposed region 18*b* and the flange-shaped member 36 is too small to insert the insertion member 46, the exposed region 18*b* is pressed directly by the presser bolt 48.

The insertion members 42 and 46, as well as the pressing members provided by the presser bolts 44 and 48 are each made of non-magnetic material such as aluminum and stainless steel. The platy insertion member 42 has specific dimensions (area of main surfaces and thickness) and a shape selected in accordance with the gaps between the outer circumferential surface 18*a* and the frame-like member 34. The same applies to the insertion member 46, i.e., the platy insertion member 46 has specific dimensions and a shape selected in accordance with the gaps between the exposed region 18*b* and the flange-shaped member 36.

The presser bolts 44 and 48 are provided by, for example, an M6 check bolt which has a hexagon hole. The presser bolt is threaded into the frame-like member 34 using an unillustrated torque wrench, threaded through the frame-like member 34, and then pressed to the insertion member 42 or the outer circumferential surface 18*a*. Likewise, the presser bolt 48 is threaded into the flange-shaped member 36 using a torque wrench, threaded through the flange-shaped member 36, and then pressed to the insertion member 46 or the exposed region 18*b*. In this step, it is preferable that the presser bolts 44 and 48 are torqued to approximately 2.5 N·m. Using the torque value as mentioned above makes sure that the permanent magnets 20 are pressed sufficiently while preventing deformation of the frame-like member 34 or the flange-shaped member 36 as well as damage to the permanent magnets 20.

It should be noted here that if the insertion members 42 and 46, and the presser bolts 44 and 48 account for only a small percentage in (the volume of) the entire magnetic pole unit 11*a*, then magnetic insertion members 42 and 46, and presser bolts 44 and 48 made of a magnetic material such as iron, may be used partially (selectively). The insertion members 42 and 46 as well as the presser bolts 44 and 48 which are made of magnetic material serve as magnetic field adjustment members for obtaining a desired magnetic field in the uniform magnetic field space F, making it possible to improve the magnetic field intensity and/or magnetic field uniformity.

Like the magnetic pole unit 11*a*, the magnetic pole unit 11*b* includes a frame-like member 34, a flange-shaped member 36, insertion members 42 and 46, and presser bolts 44 and 48. No description will be made here for these members in the magnetic pole unit 11*b*.

According to the magnetic field generator 10 as described, even if there is a gap between the outer circumferential surface 18*a* and the frame-like member 34, it is possible to press the outer circumferential surface 18*a* or the insertion member 42 with the presser bolt 44 which is threaded into the frame-like member 34, whereby separation and dislocation of the permanent magnets 20 toward the outer circumferential surface 18*a* can be prevented easily and reliably. Also, even if there is a gap between the exposed region 18*b* and the flange-shaped member 36, it is possible to press the exposed region 18*b* or the insertion member 46 with the presser bolt 48 which is threaded into the flange-shaped member 36, whereby separation and dislocation of the permanent magnets 20 toward the exposed region 18*b* can be prevented easily and reliably. In other words, by using the presser bolts 44 and 48, it becomes easy to deal with the problem of shape and size variation in the permanent magnet groups 14*a* and 14*b*, so that separation and dislocation of the permanent magnets 20 from the permanent magnet groups 14*a* and 14*b* can be prevented easily, reliably and for a long time. Therefore, the invention can prevent image quality deterioration. Also, the invention can improve productivity since it is easy to prevent separation and dislocation of the permanent magnets 20 from the permanent magnet groups 14*a* and 14*b* without preparing custom-made permanent magnet fixing members, etc. to fit to unique shapes of individual permanent magnet groups 14*a* and 14*b* for each apparatus.

Permanent magnets 20 placed side by side in the lateral direction are under a strong repulsion force constantly. However, since it is possible to fix the permanent magnets 20 rigidly by using the presser bolts 44, the invention is capable of reducing the burden, in terms of the strength, of the adhesive which is used to fix the permanent magnets 20.

With the use of the insertion member 42 a single presser bolt 44 can stably press a large area of the outer circumferential surface 18*a*. Also, with use of the insertion member 46 a single presser bolt 48 can stably press a large area of the exposed region 18*b*. The invention therefore prevents separation and dislocation of the permanent magnets 20 from the permanent magnet groups 14*a* and 14*b* more reliably while reducing the number of the presser bolts 44 and 48.

Also, by placing the insertion members 42 and 46 in between, the invention prevents damage to the permanent magnets 20. Further, the insertion members 42 and 46 can fill or reduce gaps between the frame-like member 34 and the permanent magnet groups 14*a*, 14*b*, and gaps between the flange-shaped member 36 and the permanent magnet groups 14*a*, 14*b*, making it possible to further simplify the shape of the frame-like member 34 and the flange-shaped member 36.

By using the frame-like member 34 which follows the outer circumferential surface 18*a*, as the cover member, the invention provides an easy and reliable solution for preventing separation and dislocation of the permanent magnets 20 toward the outer circumferential surface 18*a*, while making it possible to improve productivity. It is easy to find any relatively large gaps between the outer circumferential surface 18*a* and the frame-like member 34. Only a short glance is required to determine where to dispose the insertion members 42.

By using the flange-shaped member 36 which covers the exposed region 18*b* as a cover member, the invention provides an easy and reliable solution for preventing separation and dislocation of the permanent magnets 20 toward the exposed region 18b, while making it possible to improve productivity. It is easy to find any relatively large gaps between the exposed region 18b and the flange-shaped member 36. Only a short glance is required to determine where to dispose the insertion members 46.

The cover members provided by the frame-like member 34 and the flange-shaped member 36 are made of non-magnetic material. Thus, the invention prevents separation and dislocation of the permanent magnets 20 from the permanent magnet group 14a and 14b without causing adverse influence to the intended magnetic field. Also, by using an arrangement that some of the insertion members 42 and 46 and the presser bolts 44 and 48 are made of magnetic materials, the invention makes it possible to adjust the magnetic field in the uniform magnetic field space F, and to improve magnetic field intensity and/or magnetic field uniformity.

When the presser bolts 44 and 48 are threaded into their respective bolt holes 38 and 40, it is desirable that each of the presser bolts 44 and 48 is locked by an anti-loosening member. Specifically, an adhesive or other anti-loosening agent may be applied to the presser bolts 44 and 48 or the bolt holes 38 and 40, or a locknut etc. may be threaded around the presser bolts 44 and 48, to eliminate loosening of the presser bolts 44 and 48.

Conventionally, when permanent magnets are bonded to each other, an epoxy or acrylic adhesive, for example, is placed between the two permanent magnets and then these magnets are held firmly for a few minutes. However, according to the magnetic field generator 10, the frame-like member 34, the flange-shaped member 36, the presser bolts 44 and 48, etc. can be utilized to firmly hold the permanent magnets 20. Consequently, it is possible to use quick setting adhesives such as cyanoacrylate adhesives. In this case, the permanent magnets 20 can be bonded to each other with the adhesive within a reduced time, so the arrangement makes it easy to assemble the permanent magnet groups 14a and 14b. It should be noted here that cyanoacrylate adhesives used as quick setting adhesives are high in peeling strength but low in impact resistance and heat resistance. This can lead to an earlier deterioration even if the adhesives are stored in room temperatures. However, by combining quick setting adhesive with the present invention, it becomes possible to fix the permanent magnets which are included in a magnetic field generator for a long period of time.

It should be noted here that FIG. 3 and FIG. 5 show a state where all of the bolt holes 38 are threaded by the presser bolts 44, and all of the bolt holes 40 are threaded by the presser bolts 48. However, the presser bolts 44 or 48 may be threaded into only those holes located at places which require pressing on the outer circumferential surface 18a, the exposed region 18b and the insertion members 42 and 46.

In the embodiment described above, description was made for a case where the frame-like member 34 is provided and then the insertion members 42 are inserted into gaps if there are any between the outer circumferential surface 18a and the frame-like member 34. However, the present invention is not limited to this. For example, there may be an arrangement that the insertion member 42 is bonded to each face in the zigzag-shaped outer circumferential surface 18a, and then the frame-like member 34 is provided to surround each of the permanent magnet groups 14a and 14b. Obviously in this case, each frame-like member 34 is sized to surround a corresponding one of the permanent magnet groups 14a and 14b together with the insertion members 42 attached thereto.

Also, in the embodiment described above, description was made for a case where the flange-shaped member 36 is provided and then the insertion members 46 are inserted into gaps if there are any between the exposed region 18b and the flange-shaped member 36. However, the present invention is not limited to this. For example there may be an arrangement that the insertion members 46 are bonded to the permanent magnet groups 14a and 14b to cover the exposed region 18b, and then the flange-shaped member 36 is provided on the permanent magnet groups 14a and 14b.

In the embodiment described above, description was made for a case where the frame-like member 34 faces the entire outer circumferential surface 18a. However, the frame-like member is not limited to this. The frame-like member may be opposed only to part of the outer circumferential surface of the permanent magnet group. For example, the frame-like member may be constituted by one frame-like member piece 34a.

In the embodiment described above, description was made for a case where the flange-shaped member 36 covers the entire exposed region 18b. However, the frame-like member is not limited to this. The flange-shaped member may cover only part of the exposed region of the permanent magnet group. For example, the flange-shaped member may be constituted by one flange-shaped member piece 36a.

In the embodiment described above, description was made for a case where the frame-like members 34 and the flange-shaped members 36 are provided as the cover members. However, one of the two kinds, i.e., the frame-like members 34 or the flange-shaped members 36 may not be provided. Specifically, there may be an arrangement for preventing separation and dislocation of the permanent magnets 20 only toward the outer circumferential surface 18a, or for preventing separation and dislocation of the permanent magnets 20 only toward the exposed region 18b.

In the embodiment described above, description was made for a case where the frame-like member 34 and the flange-shaped member 36 are used as the cover members. However, the cover members are not limited to these.

Next, other examples of the cover member will be described with reference to FIG. 6.

Figure 6:
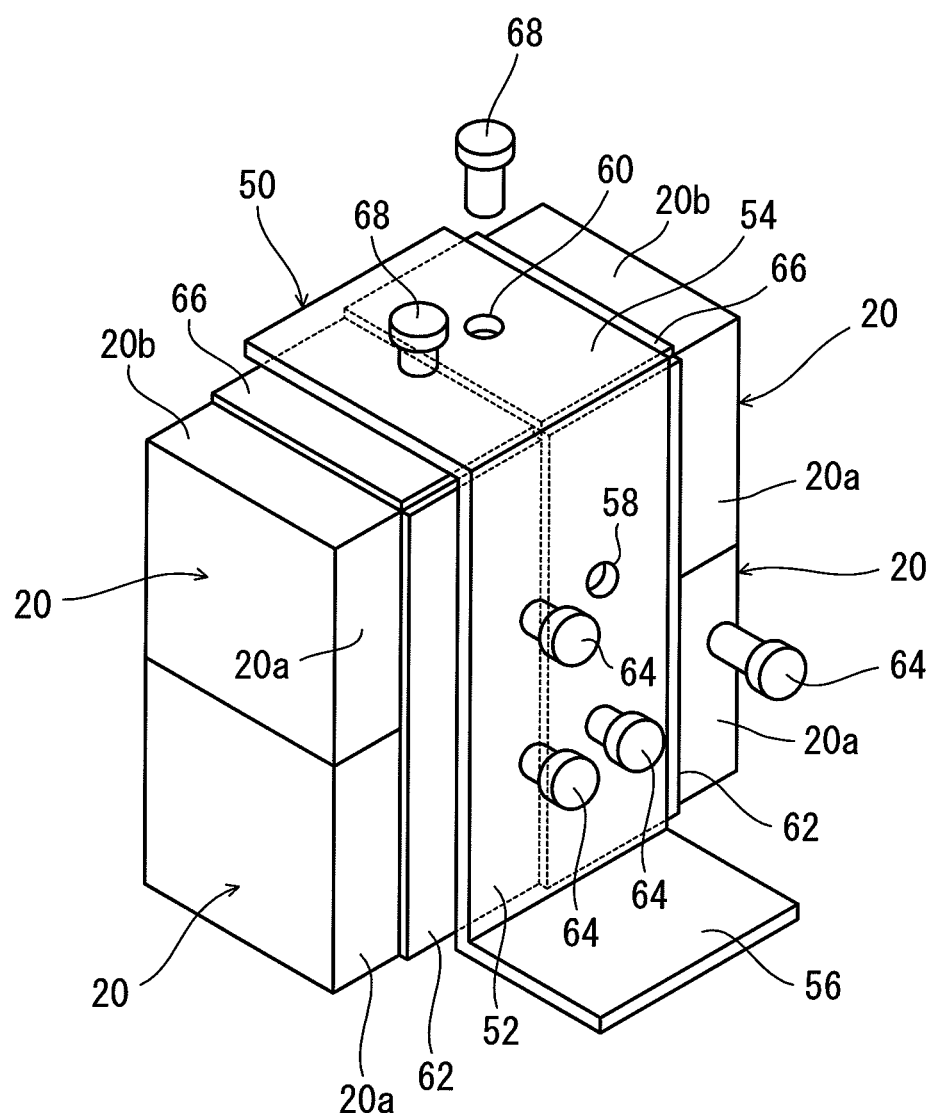
FIG. 6 is a perspective view showing another example of cover member.

A plate-like member 50 as shown in FIG. 6 may be fixed as the cover member to a desired position around the permanent magnet group 14a and 14b with unillustrated fixing members such as a bolt. The plate-like member 50 is provided to partially cover the permanent magnet groups 14a and 14b. Likewise, plate-like members 50a, 50b to be described later are provided to partially cover the permanent magnet groups 14a and 14b.

As shown in FIG. 6, the plate-like member 50 is a platy member which has been bent twice and has a first flat portion 52, a second flat portion 54 and a third flat portion 56. The first flat portion 52 is opposed to surfaces (indicated by a reference symbol "20a") which make the outer circumferential surface 18a (see FIG. 2) in the permanent magnets 20. The second flat portion 54 is opposed to surfaces (indicated by a reference symbol "20b") which make the exposed region 18b (see FIG. 2) in the permanent magnets 20. The third flat portion 56 is fixed to the plate yoke 12a or 12b (see FIG. 1). The first flat portion 52 includes a plurality (four in this embodiment) of bolt holes 58 penetrating the portion from the outer side (the side away from the permanent magnets 20) to the inner side (the side opposing to the permanent magnets 20). Likewise, the second flat portion 54 includes a plurality (two in this embodiment) of bolt holes 60 penetrating the portion from the upper side to the lower side.

Platy insertion members 62 are inserted into a gap between the surfaces 20a of the permanent magnets 20 and the first flat portion 52. The insertion members 62 are pressed onto the surfaces 20a of the permanent magnets 20 with presser bolts 64 threaded into the bolt holes 58. In other words, the insertion members 62 are pressed onto the outer circumferential surfaces 18a (see FIG. 2) of the permanent magnet groups 14a and 14b.

Also, platy insertion members 66 are inserted into a gap between the surfaces 20b of the permanent magnets 20 and the second flat portion 54. The insertion members 66 are pressed onto the surfaces 20b of the permanent magnets 20 with presser bolts 68 threaded into the bolt holes 60. In other words, the insertion members 66 are pressed onto the exposed regions 18b (see FIG. 2) of the permanent magnet groups 14a and 14b.

Use of these plate-like member 50, insertion members 62 and 66 and presser bolts 64 and 68 also makes it possible to easily and reliably prevent separation and dislocation of the permanent magnets 20 from the permanent magnet groups 14a, 14b.

Figure 7:
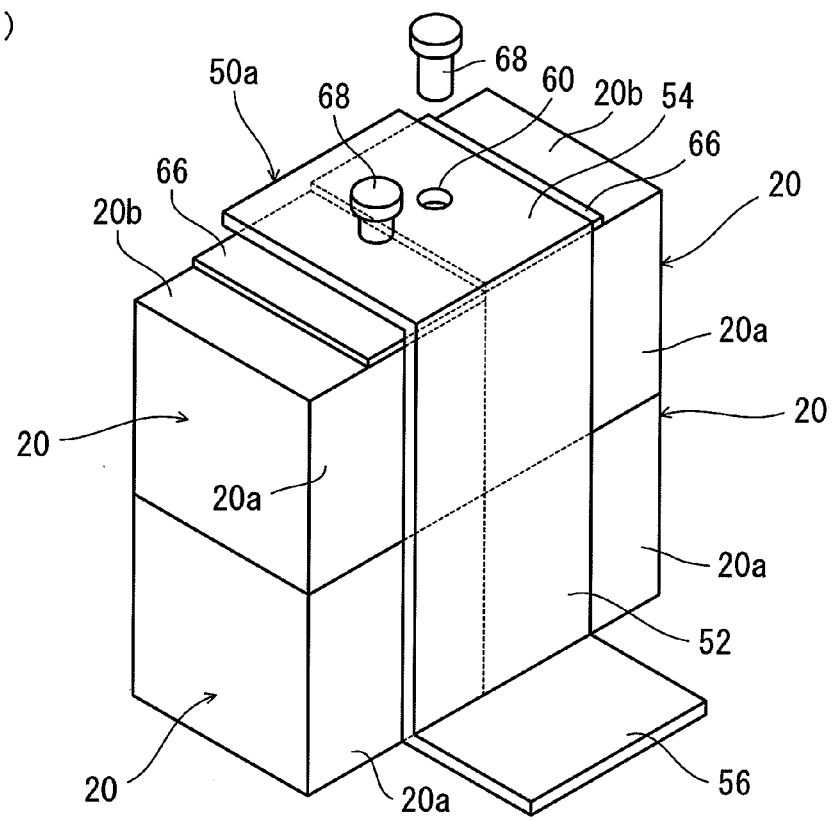
FIG. 7 is a perspective view showing still another example of cover member.
Figure 7:
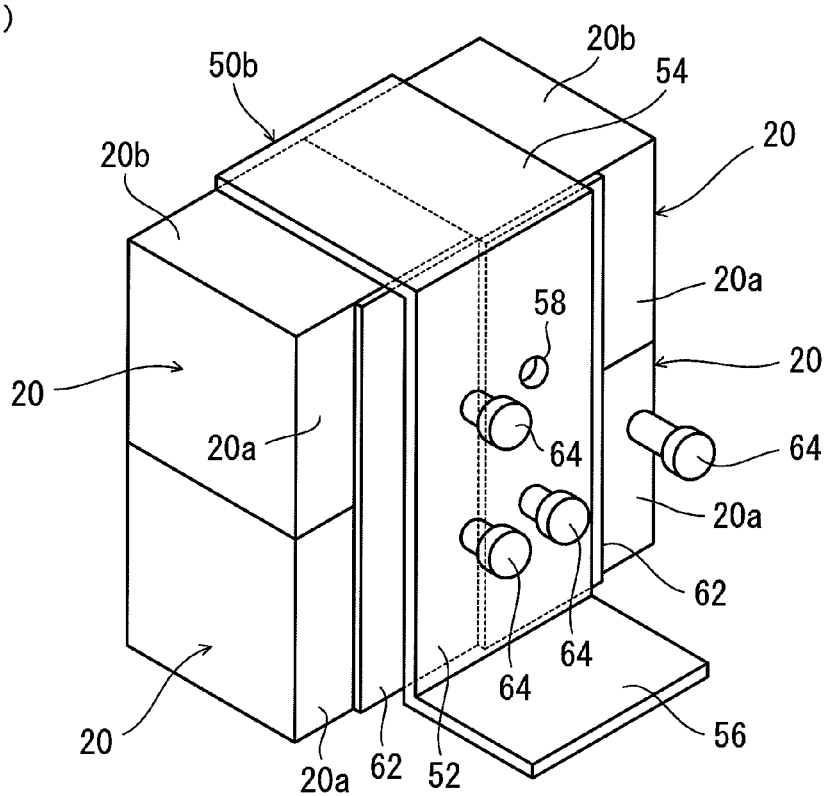

Also, in cases as shown in FIG. 7(a) where surfaces 20a are substantially flush in a plurality (four in this embodiment) of mutually adjacent permanent magnets 20, a plate-like member 50a which does not have bolt holes 58 in the first flat portion 52 may be used, with the first flat portion 52 bonded directly to the surfaces 20a of the permanent magnets 20. In this case, separation and dislocation of the permanent magnets 20 toward the outer circumferential surface 18a (see FIG. 2) can be prevented without the use of the insertion member 62 or the presser bolt 64.

Further, in cases as shown in FIG. 7(b) where surfaces 20b are substantially flush in a plurality (two in this embodiment) of mutually adjacent permanent magnets 20, a plate-like member 50b which does not have bolt holes 60 in the second flat portion 54 may be used, with the second flat portion 54 bonded directly to the surfaces 20b of the permanent magnets 20. In this case, separation and dislocation of the permanent magnets 20 toward the exposed region 18b (see FIG. 2) can be prevented without the use of the insertion member 66 or the presser bolt 68.

It should be noted here that if the gap between the surface 20b and the second flat portion 54 is too small to insert the insertion member 66 in a case of using the plate-like member 50 or 50a, it is preferable that the permanent magnets 20 are pressed directly by the presser bolts 68. Likewise, if the gap between the surface 20a and the first flat portion 52 is too small to insert the insertion member 66 in a case of using the plate-like member 50 or 50b, it is preferable that the permanent magnets 20 are pressed directly by the presser bolts 64.

In the embodiments given above, description was made for cases where platy insertion members are used. However, the insertion member is not limited to this. As shown in FIG. 8, insertion members 70 may be blocks which have a triangular or rectangular section in a plan view. In this case, it is preferable that the cover member is provided by a frame-like member 72 which includes a plurality of platy (like a flat plate) frame-like member pieces 72a, and the insertion members 70 are pressed onto the outer circumferential surface 18a by presser bolts 74 threaded through the frame-like member pieces 72a. The frame-like member 72 which includes platy (flat-plate-like) frame-like member pieces 72a as described are easy to obtain and can be utilized commonly. Preferably, placements of the frame-like member pieces 72a and shapes of the block-like insertion members 70 are designed so that the presser bolts 74 make their contact approximately perpendicularly to the surface of the corresponding insertion members 70.

Figure 9:
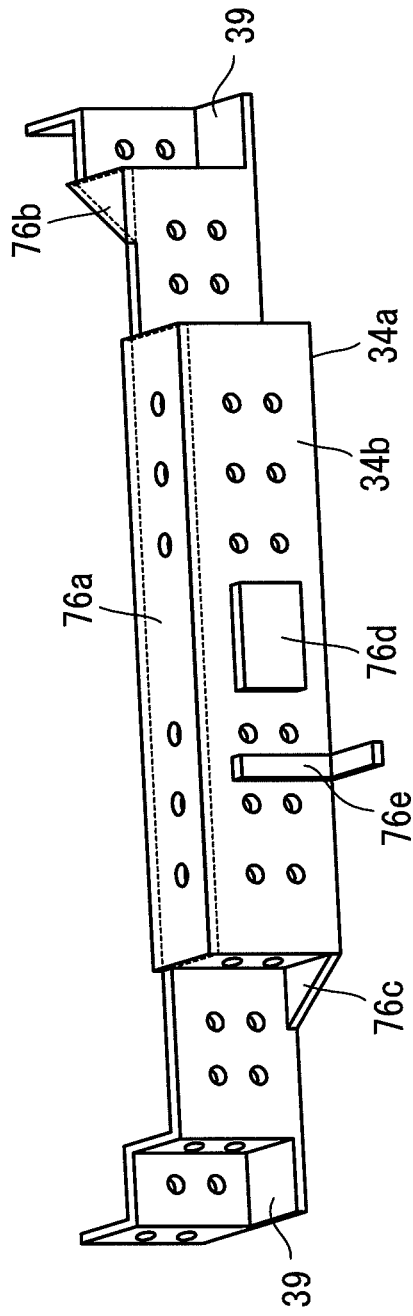
FIG. 9 is a perspective view showing an example of reinforcing members.

Also, the frame-like member piece 34a may be formed with various reinforcing members 76a through 76e as shown in FIG. 9.

The reinforcing member 76a is a strip-like top plate provided at an upper portion of the frame-like member piece 34a. The reinforcing member 76b is a triangular top plate provided at an upper corner portion of the frame-like member piece 34a. The reinforcing member 76c is a triangular bottom plate provided at a lower corner portion of the frame-like member piece 34a. The reinforcing member 76d is a plate-like member provided on a side surface of the frame-like member piece 34a. The reinforcing member 76e is an L-shaped member provided to abut on a side surface of the frame-like member piece 34a and on the plate yoke 12a or 12b. The reinforcing member 76e is fixed to the plate yoke 12a or 12b with unillustrated fixing members such as bolts. The reinforcing members 76a through 76e may be formed onto the frame-like member piece 34a by means of welding for example.

The reinforcing members 76a through 76e formed on the frame-like member piece 34a increase strength of the frame-like member 34a when withstanding the repulsion force from the permanent magnet groups 14a, 14b exerted to the pressing members, preventing separation or dislocation of the permanent magnets 20 from the permanent magnet groups 14a, 14b more effectively. Providing the reinforcing members 76a through 76e in the frame-like member piece 34a as shown in FIG. 9, i.e., in vicinity of a long flat surface portion 34b is particularly effective. It should be noted here that the arrangement requires that at least one of the reinforcing members 76a through 76e is formed in the frame-like member piece 34a.

In the embodiments given above, description was made for cases where the presser bolt has a constant diameter in the gap between the cover member and the permanent magnet groups. However, the pressing member is not limited to this. The pressing member may be provided by a presser bolt which has an increased diameter at an end portion that makes contact with the permanent magnet group. For example, the pressing member may be provided by a bolt which has a head, that the bolt is threaded to the cover member in advance so that its head will face the permanent magnet group. In this case, the permanent magnet group is pressed by the head of the bolt. It is preferable that the other end of the bolt away from the head is formed with a hole for fitting a hexagonal wrench or a groove for fitting a screw driver. With such an arrangement, the bolt can be threaded easily. Further, the pressing member may be provided by a pair of a bolt and a nut, so that the bolt is threaded in the cover member and the nut is then threaded around the end of the bolt to face the permanent magnet group. In this arrangement, the permanent magnet group can be pressed by the nut. With these arrangements provided for an increased area of contact with the permanent magnet group by the pressing member, it becomes possible to press the permanent magnet group stably.

In the embodiment described above, description was made for cases where the yoke is constituted by the plate yokes 12a, 12b and a support yoke 28. However, the present invention is not limited to this. For example, a C-shaped, integrated yoke which connects a pair of permanent magnet groups 14a, 14b magnetically may be used.

In the embodiments given above, description was made for cases where the magnetic pole units 11a and 11b are provided with the permanent magnet groups 14a and 14b respectively. However, the present invention is not limited to this. For example, the magnetic pole unit 11b may not be provided with the permanent magnet group 14b.

It should be noted here that the cover members (frame-like member, flange-shaped member), the pressing members and the insertion members which constitute the present invention can be retrofitted to conventional magnetic field generators which do not have these constitutional members. In this case, even if there is positional misalignment in the permanent magnets in the magnetic field generator due to a long period of use of the magnetic field generator, it is possible to correct the permanent magnet positions and restore the magnetic field uniformity if the positional misalignments are within a few-millimeter range.

The present invention being thus far described in terms of preferred embodiments, it is obvious that these may be varied in many ways within the scope and the spirit of the present invention. The scope of the present invention is only limited by the accompanied claims.

The invention claimed is:

1. A magnetic field generator comprising:
    a permanent magnet group including a plurality of permanent magnets bonded together, for generation of a magnetic field on a first main-surface side of the permanent magnet group;
    a cover member including a frame-like member provided to surround the permanent magnet group;
    a block-like insertion member for insertion into a gap between the permanent magnet group and the frame-like member; and
    a pressing member provided in the frame-like member for pressing the permanent magnet group; wherein the pressing member is threaded into the frame-like member and presses the insertion member to an outer circumferential surface of the permanent magnet group, thereby fixing the permanent magnet without coming into direct contact with the permanent magnet.

2. A magnetic field generator comprising:
    a permanent magnet group including a plurality of permanent magnets bonded together, for generation of a magnetic field on a first main-surface side of the permanent magnet group;
    a plate yoke provided with the permanent magnet group;
    a cover member including a frame-like member provided to surround the permanent magnet group; wherein the frame-like member includes a plurality of frame-like member pieces;
    an insertion member for insertion into a gap between the permanent magnet group and the frame-like member;
    a pressing member provided in the frame-like member for pressing the permanent magnet group; wherein the pressing member is threaded into the frame-like member and presses the insertion member to an outer circumferential surface of the permanent magnet group, thereby fixing the permanent magnet without coming into direct contact with the permanent magnet; and
    a reinforcing member provided in the frame-like member; wherein the reinforcing member includes at least one of a first top plate provided at an upper portion of the frame-like member piece, a second top plate provided at an upper corner portion of the frame-like member piece, a bottom plate provided at a lower corner portion of the frame-like member piece, a plate-like member provided on a side surface of the frame-like member piece, and an L-shaped member provided to abut on a side surface of the frame-like member piece and on the plate yoke.

3. The magnetic field generator according to claim 2, wherein
    the reinforcing member includes the first top plate;
    the magnetic field generator further including an insertion member for insertion into a gap between the first top plate and the permanent magnet group; wherein the insertion member is made of a magnetic material selectively.

4. The magnetic field generator according to claim 1 or 2, wherein the pressing member presses the permanent magnet group, thereby preventing separation of the permanent magnet from the permanent magnet group.

5. The magnetic field generator according to claim 1 or 2, further including a pole piece provided in the first main surface of the permanent magnet group while leaving an exposed region in the first main surface; wherein
    the cover member includes a flange-shaped member provided in an outer circumferential surface of the pole piece to cover the exposed region of the permanent magnet group; and
    the pressing member is also provided in the flange-shaped member for pressing the permanent magnet group.

6. The magnetic field generator according to claim 1 or 2, wherein the cover member is a non-magnetic member.

* * * * *